(12) United States Patent
Yeh

(10) Patent No.: US 8,376,770 B2
(45) Date of Patent: Feb. 19, 2013

(54) ELECTRICAL CONNECTOR INCORPORATED WITH POSITIONING PLATE AND LATCH

(75) Inventor: Cheng-Chi Yeh, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/193,633

(22) Filed: Jul. 29, 2011

(65) Prior Publication Data

US 2012/0108096 A1   May 3, 2012

(30) Foreign Application Priority Data

Oct. 27, 2010   (TW) ................................ 99220715 U

(51) Int. Cl.
*H01R 13/62* (2006.01)
(52) U.S. Cl. ....................................................... 439/331
(58) Field of Classification Search .................. 439/331, 439/73
See application file for complete search history.

(56) References Cited

U.S. PATENT DOCUMENTS

| | | | | |
|---|---|---|---|---|
| 4,204,722 A * | 5/1980 | Yasui et al. ..................... 439/71 |
| 4,253,719 A * | 3/1981 | McGinley ...................... 439/329 |
| 4,381,131 A * | 4/1983 | Demnianiuk .................. 439/368 |
| 4,515,425 A * | 5/1985 | Nakano .......................... 439/73 |
| 4,621,884 A * | 11/1986 | Berkebile et al. ............. 439/367 |
| 5,247,250 A * | 9/1993 | Rios .......................... 324/750.22 |
| 5,448,449 A * | 9/1995 | Bright et al. ................... 361/704 |
| 6,626,683 B2 * | 9/2003 | Lai .................................... 439/73 |
| 7,077,680 B1 * | 7/2006 | Wang et al. .................... 439/331 |
| 7,083,456 B2 * | 8/2006 | Trout et al. .................... 439/326 |
| 7,182,619 B2 * | 2/2007 | Hsu ................................ 439/331 |
| 7,195,507 B2 * | 3/2007 | Watanabe ...................... 439/331 |
| 7,542,104 B2 * | 6/2009 | Cai et al. .......................... 349/58 |
| 7,708,580 B2 * | 5/2010 | Yeh ................................ 439/331 |
| 7,753,703 B2 | 7/2010 | Liao et al. |
| 7,762,827 B2 * | 7/2010 | Liu ................................ 439/331 |
| 7,803,006 B2 * | 9/2010 | Lin ................................ 439/331 |
| 7,833,021 B2 * | 11/2010 | Lin .................................. 439/68 |
| 7,878,837 B2 * | 2/2011 | Hsieh et al. ................... 439/331 |
| 7,892,008 B2 * | 2/2011 | Hsu et al. ...................... 439/331 |
| 7,955,113 B2 * | 6/2011 | Chang ........................... 439/331 |
| 7,985,090 B2 * | 7/2011 | Hsu et al. ...................... 439/331 |
| 2009/0233464 A1 * | 9/2009 | Yeh ................................ 439/73 |
| 2010/0184314 A1 * | 7/2010 | Yeh .............................. 439/157 |

* cited by examiner

*Primary Examiner* — Amy Cohen Johnson
*Assistant Examiner* — Vladimir Imas
(74) *Attorney, Agent, or Firm* — Wei Te Chung; Ming Chieh Chang

(57) ABSTRACT

An electrical connector includes an insulative housing having a base and a plurality of periphery walls extending upward from the base to define an inner cavity. A fastening assembly includes a retention plate pivotally assembled with a rear end of the insulative housing and a latch assembled at a front end of the insulative housing, the latch including a retention arm assembled in the periphery wall, a linking portion extending upwardly from the retention arm, and a handle portion extending from the linking portion and having a bottom surface locking the retention plate and a top surface for operating.

5 Claims, 6 Drawing Sheets

ELECTRICAL CONNECTOR INCORPORATED WITH POSITIONING PLATE AND LATCH

BACKGROUND OF THE INVENTION

1. Field of the Invention

The present invention relates to an electrical connector, and more particularly to an electrical connector having a latch assembled on an insulative housing to lock a retention plate thereof 2. Description of Related Art U.S. Pat. No. 7,753,703 issued to Liao et al. on Jul. 13, 2010 discloses a land grid array (LGA) connector electrically connecting an electronic package and a printed circuit board. The LGA connector includes an insulative housing surrounded by periphery sidewalls and a plurality of contacts received in the insulative housing. The insulative housing provides a pair of latchs on the periphery sidewalls for providing sustaining retention force to the electronic package. The latch includes a body portion extending upwardly from the periphery sidewall, a hook extending toward the electronic package, and a pressing portion extending away from the electronic package. The latch has little elastic for being integrally formed with the insulative housing with a small construction.

Therefore, an improved electrical connector is needed.

SUMMARY OF THE INVENTION

An object of the present invention is to provide an electrical connector having a latch assembled on an insulative housing to lock a retention plate thereof.

To achieve the aforementioned object, an electrical connector comprises an insulative housing having a base and a plurality of periphery walls extending upward from the base to define an inner cavity. A fastening assembly includes a retention plate pivotally assembled in a rear end of the insulative housing and a latch assembled at a front end of the insulative housing, the latch comprising a retention arm assembled with the periphery wall, a linking portion extending upwardly from the retention arm, and a handle portion extending from the linking portion and having a bottom surface locking the retention plate and a top surface for operating.

To further achieve the aforementioned object, an electrical connector comprises an insulative housing, a retention plate, and a latch. The insulative housing has a base and a plurality of periphery walls extending upward from the base to define an inner cavity. The retention plate is assembled to one end of the insulative housing and has a tongue. The latch comprises a retention arm assembled in the periphery wall and a handle portion extending outwardly away from the cavity to press the tongue of the retention plate and be pressed by operator.

Other objects, advantages and novel features of the invention will become more apparent from the following detailed description of a preferred embodiment when taken in conjunction with the accompanying drawings.

DETAILED DESCRIPTION OF THE INVENTION

Figure 1:
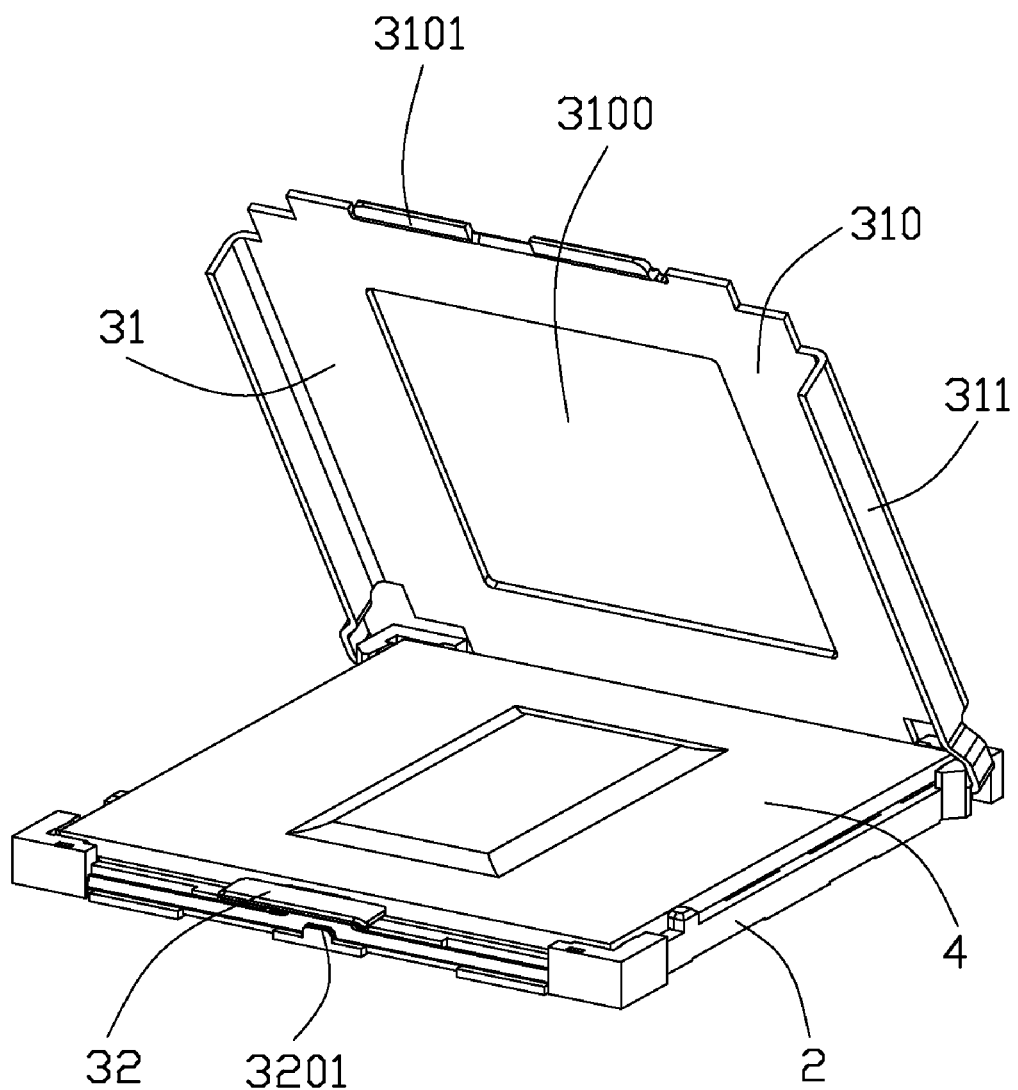
FIG. 1 is an assembly, perspective view of an electrical connector of the present invention, showing a retention plate positioned at an open position.
Figure 2:
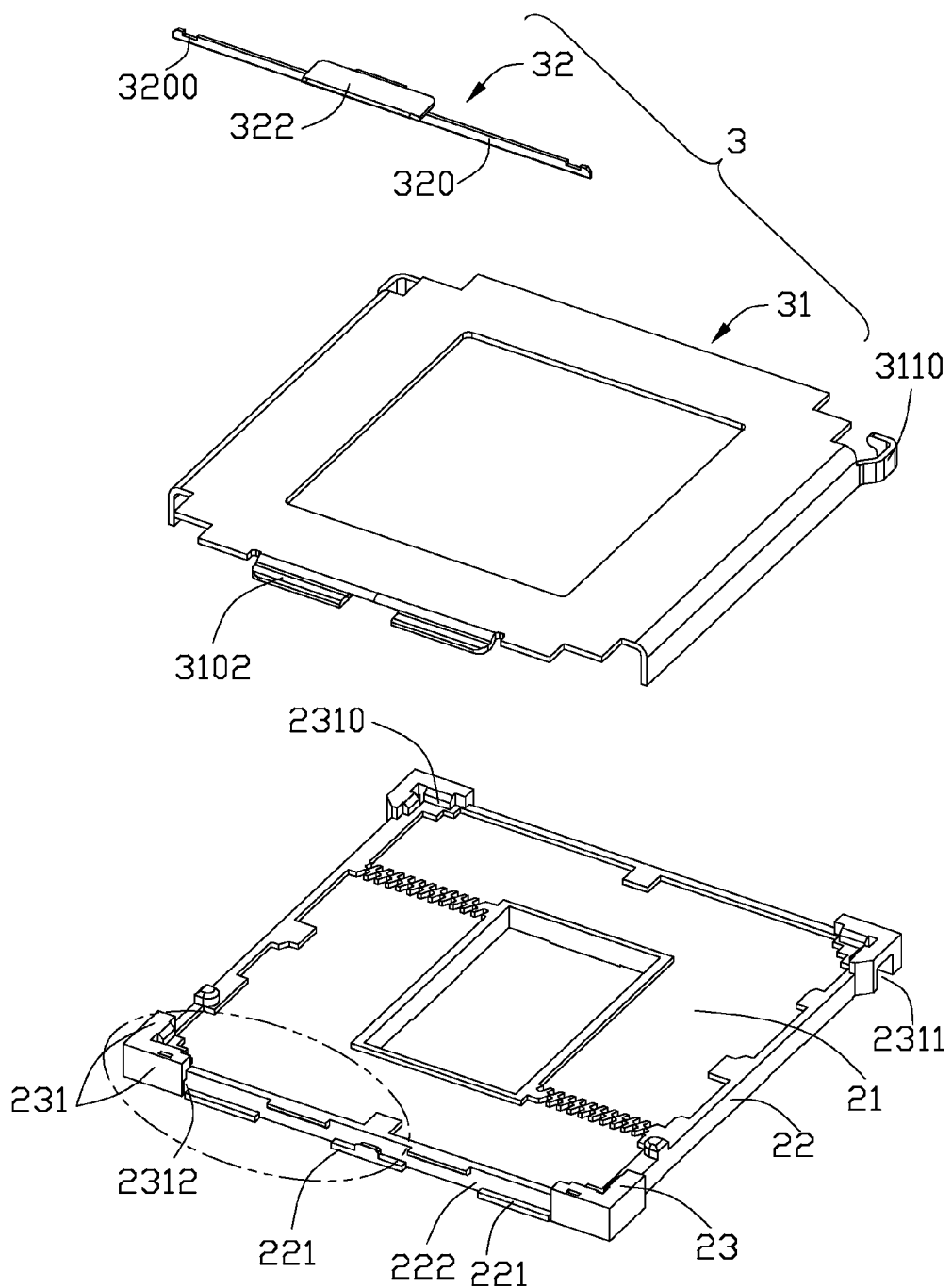
FIG. 2 is an exploded, perspective view of the electrical connector of FIG. 1.

Referring to FIG. 1 to FIG. 2, an electrical connector is used for electrically connected an electronic package 4 to a printed circuit board (not shown). The electrical connector includes an insulative housing 2, a plurality of contacts (not shown) received in the insulative housing 2, and a fastening assembly 3. The fastening assembly 3 comprises a retention plate 31 pivotally assembled in a rear end of the insulative housing 2 and a latch 32 assembled at a front end of the insulative housing 2.

Figure 3:
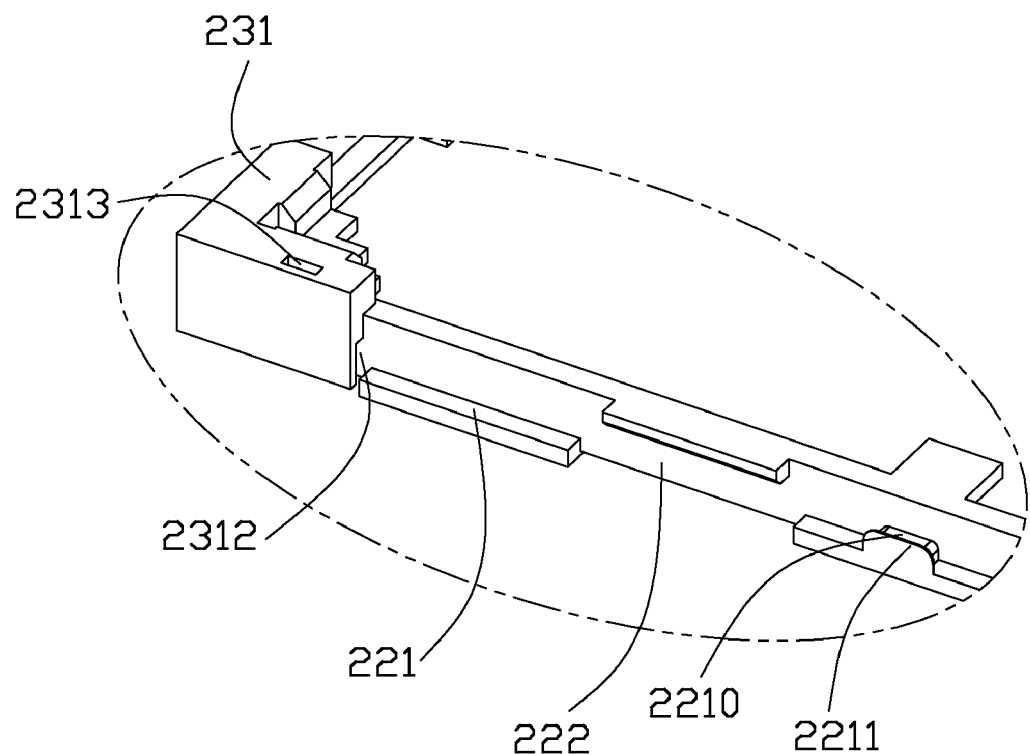
FIG. 3 is an enlarged view of the part labeled by a circle as shown in FIG. 2.

Referring to FIG. 2 to FIG. 3, the insulative housing 2 is configured with a substantially rectangular structure and comprises a base 21 and a plurality of periphery walls 22 extending upward from the base 21 to define an inner cavity for receiving the electronic package 4. Four protrusions 23 are disposed at corners of the periphery walls 22 and each comprises two part sidewalls 231 perpendicular to each other. Each sidewalls 231 has a datum 2310 protruding toward the cavity for orientating the electronic package 4. The protrusions 23 are divided into two groups, and each group has the same configuration. A group of protrusions 23 positioned at the rear end of the insulative housing 2, and each protrusion 23 has a receiving hole 2311 to retain the retention plate 31.

Continue referring to FIG. 2 to FIG. 3, the insulative housing 2 has a plurality of ribs 221 which are disposed at an upper and a lower positions of the periphery walls 22 of the front end to define a channel 222 for receiving the latch 32. The protrusions 23 has mating holes 2312 extending horizontally and corresponding to the channel 222, and retention holes 2313 extending vertically and communicating with the mating holes 2312. One of the ribs 221 defined at a lower middle position of the periphery wall 22 has a block 2210 protruding upwardly and a flange 2211 disposed at the outer sides of the block 2210. The upper position of the periphery wall 22 corresponding to the rib 221 with the block 2210 defines a gap to allow the latch 32 passing through.

Referring to FIGS. 1 and 2, the retention plate 310 includes a planar board 310 with an opening 3100 and a pair of sidewalls 311 extending downwardly at opposite sides of the board 310. A pair of tongues 3101 are extending downwardly and then horizontally from the front end of the planar board 310, and the horizontal part formed a supporting portion 3102. Each sidewall 311 has a bearing portion 3110 with a half-hoop shape to assembled in the receiving holes 2311 for allowing the retention plate 31 to rotate related to the insulative housing 2.

Figure 4:
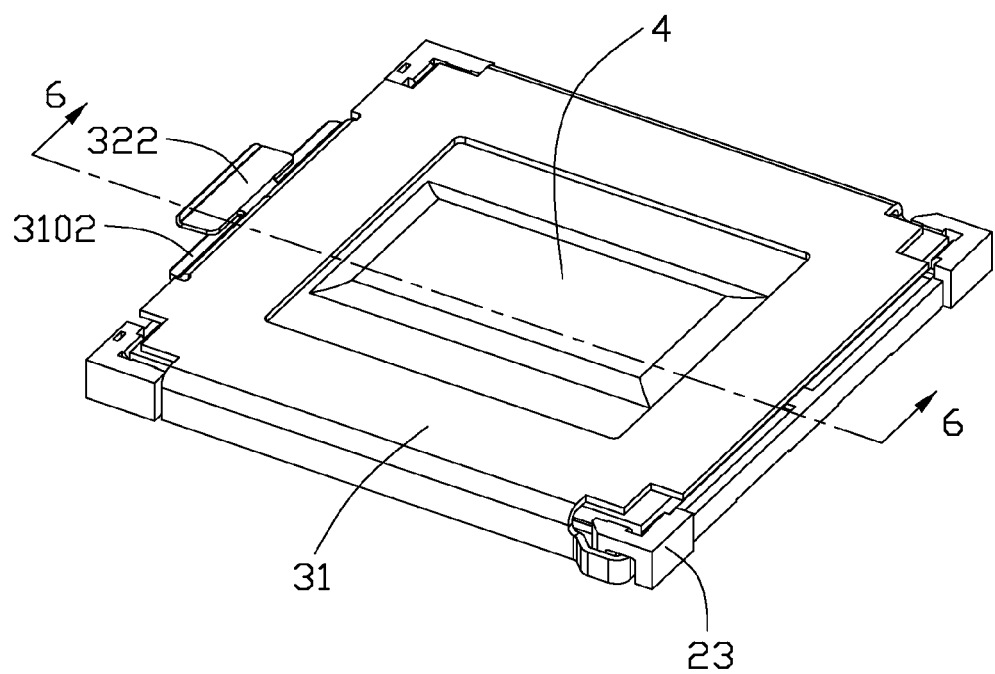
FIG. 4 is an assembly, perspective view of the electrical connector, showing the retention plate positioned at a closed position.
Figure 6:
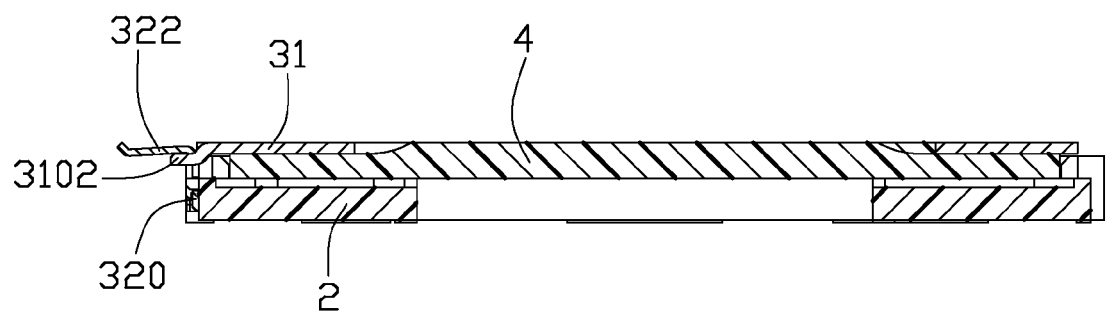
FIG. 6 is a cross-section view taken along line 6-6 of FIG. 4.

The latch 32 is made by a metal sheet and includes a long and narrow retention arm 320 received in the channel 222 of the insulative housing 2. The retention arm 320 defines a cutout 3201 disposed at a middle bottom for retain the block 2210 of the rib 221. A pair of grooves 3200 are defined near free ends of the retention arm 320 to be retained in the mating holes 2312 and the free ends of the retention arm 320 are assembled in the retention holes 2313. The latch 32 further includes a linking portion 321 extending upwardly from the retention arm 320 and a handle portion 322 extending horizontally from the linking portion 322. The linking portion is narrow than the handle portion 322 for allowing the bottom surface of two sides of the handle portion 322 to press the supporting portions 3102 of the tongues 3101. Referring to FIGS. 4 and 6, the handle portion 322 extends outwardly away from the receiving cavity of the insulative housing 2 and has a bottom surface locking and pressing the retention plate 31 and a top surface for operating by operators.

Figure 5:
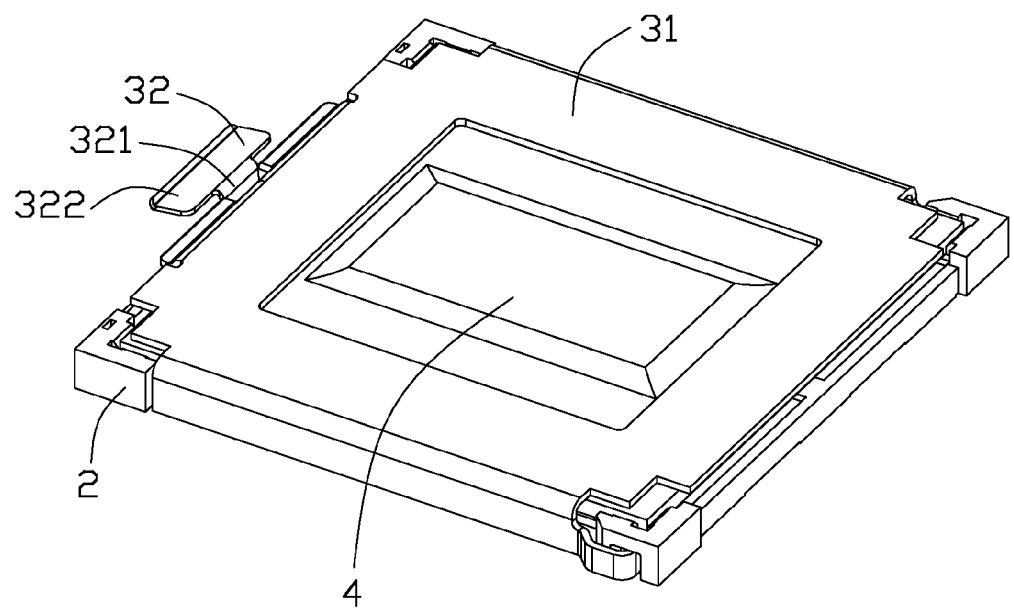
FIG. 5 is a schematic view of the electrical connector, showing a force exerted on a latch of the electrical connector.

Referring to FIG. 5, the retention plate 310 is opened or closed by exerting an exerted force to the handle portion 322. Then the retention plate 310 is released since the handle portion 322 is rotated about the retention arm 320 by the force.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   an insulative housing having a base and a plurality of periphery walls extending upward from the base to define an inner cavity;
   a fastening assembly including a retention plate pivotally assembled in a rear end of the insulative housing and a latch assembled at a front end of the insulative housing, the latch comprising a retention arm assembled with the periphery wall, a linking portion extending upwardly from the retention arm, and a handle portion extending from the linking portion; wherein
   a top surface of the handle portion is driven by an external force so as to outwardly remove the handle portion from the cavity and let the retention plate to be closed in position; and wherein
   once the external force is withdrawn, the handle portion recovers as to press the retention plate and prevent the retention plate from disengaging from the handle portion along a vertical direction;
   wherein the retention plate has two tongues extending from a front end and defining a slot therebetween, and when the latch locking the retention plate, the linking portion located in the slot and the handle portion located upon the slot;
   wherein the handle portion has two ends wider than the linking portion so that bottom surface of the two ends can press and lock the tongues.

2. An electrical connector comprising:
   an insulative housing having a base and a plurality of periphery walls extending upward from the base to define an inner cavity;
   a retention plate assembled to one end of the insulative housing and having a tongue; and
   a latch comprising a retention arm assembled in one of the periphery walls and a handle portion capable of extending outwardly away from the cavity by exerting a downwardly force so that the handle portion can unlatch the retention plate;
   wherein a plurality of ribs are defined on outer side of the periphery wall to define a horizontal channel to receive the retention arm whether the latch locking the retention plate or not;
   wherein one of the ribs has a block protruding upwardly and match with a cutout defined on the retention arm, and a flange is disposed at the outer sides of the block to secure the latch.

3. The electrical connector as claimed in claim 2, wherein the periphery wall of insulative housing having two mating holes communicate with the channel to retain two free ends of the retention arm.

4. The electrical connector as claimed in claim 2, wherein the retention arm and the handle portion are connected by a linking portion which is narrow than the handle portion for allowing a bottom surface of the handle portion to press the tongue.

5. An electrical connector comprising:
   an insulative housing having a base and a plurality of periphery walls extending upward from the base to define an inner cavity;
   a fastening assembly including a retention plate pivotally assembled in a rear end of the insulative housing and a latch assembled at a front end of the insulative housing, the latch comprising a retention arm assembled with the periphery wall, a linking portion extending upwardly from the retention arm, and a handle portion extending from the linking portion; wherein
   a top surface of the handle portion is driven by an external force so as to outwardly remove the handle portion from the cavity and let the retention plate to be closed in position; and wherein
   once the external force is withdrawn, the handle portion recovers as to press the retention plate and prevent the retention plate from disengaging from the handle portion along a vertical direction; wherein
   the insulative housing has a plurality of ribs which are disposed at an upper and a lower positions of the periphery walls of the front end to define a channel for receiving the retention arm; wherein
   one of the ribs which is disposed at a middle lower position has a block protruding upwardly and a flange disposed at the outer sides of the block, and wherein the upper position of the periphery wall corresponding to the middle rib defines a gap to allow the latch passing through.

* * * * *